United States Patent
Tatoh et al.

(10) Patent No.: US 6,599,034 B2
(45) Date of Patent: Jul. 29, 2003

(54) SEALED AIRTIGHT CONTAINER FOR OPTICAL-SEMICONDUCTORS AND OPTICAL-SEMICONDUCTORS MODULE

(75) Inventors: Nobuyoshi Tatoh, Itami (JP); Kenji Shinma, Itami (JP); Koji Nishi, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/944,359

(22) Filed: Sep. 4, 2001

(65) Prior Publication Data

US 2002/0051610 A1 May 2, 2002

(30) Foreign Application Priority Data

Sep. 4, 2000 (JP) ........................ 2000-266756

(51) Int. Cl.[7] ................................. G02B 6/36
(52) U.S. Cl. ...................................... 385/94
(58) Field of Search ............................. 385/94, 92, 88

(56) References Cited

U.S. PATENT DOCUMENTS

| | | | | | |
|---|---|---|---|---|---|
| 5,719,979 | A | * | 2/1998 | Furuyama | 385/89 |
| 5,727,104 | A | * | 3/1998 | Sasaki et al. | 385/92 |
| 6,074,104 | A | * | 6/2000 | Higashikawa | 385/94 |
| 6,123,464 | A | * | 9/2000 | Murata et al. | 385/92 |
| 6,220,765 | B1 | * | 4/2001 | Tatoh | 385/94 |
| 6,282,352 | B1 | * | 8/2001 | Kato et al. | 385/92 |
| 6,318,906 | B1 | * | 11/2001 | Ishizaka | 385/88 |
| 6,332,720 | B1 | * | 12/2001 | Shimaoka et al. | 385/88 |
| 6,420,205 | B1 | * | 7/2002 | Sawai | 438/65 |
| 6,440,778 | B1 | * | 8/2002 | Okada et al. | 438/121 |

FOREIGN PATENT DOCUMENTS

| | | | |
|---|---|---|---|
| JP | 7-138785 | 5/1995 | |
| JP | 8-288588 | 11/1996 | ............. H01S/3/18 |
| JP | 9-213838 | 8/1997 | ........... H01L/23/12 |
| JP | 11-54642 | 2/1999 | ........... H01L/23/02 |
| JP | 11-145317 | 5/1999 | |
| JP | 2000-91695 | 3/2000 | |

* cited by examiner

Primary Examiner—Lynn D. Feild
Assistant Examiner—Hae Moon Hyeon
(74) Attorney, Agent, or Firm—McDermott, Will & Emery

(57) ABSTRACT

A sealed airtight container wherein the width of the exposed electrode part provided in a ceramic terminal part is enlarged, and the exposed electrode part is connected to a wiring part and the width of the wiring part is equal to the enlarged width of the electrode part. A sealed airtight container for an optical-semiconductor with a small heat generation in the metallized wiring layer, small power consumption and large current carrying capacity, and an optical-semiconductor module with a stable optical output can be obtained.

13 Claims, 7 Drawing Sheets

Fig.4-(a)
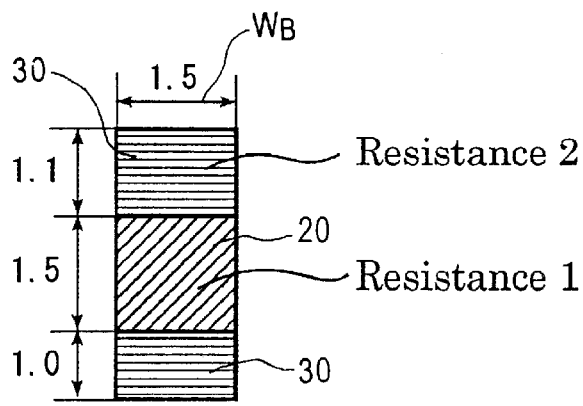
Fig.4-(b)
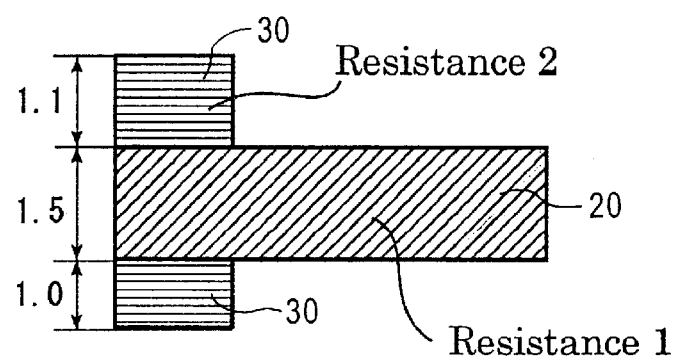
Fig.4-(c)
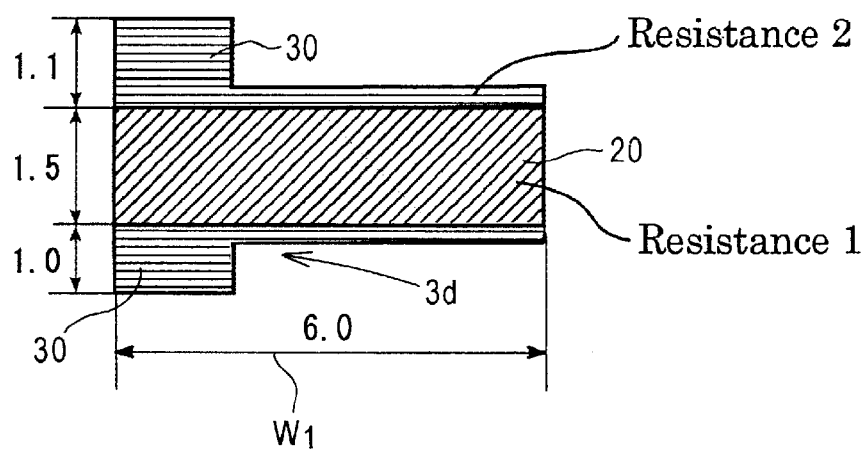

Fig.5-(a) Case 2
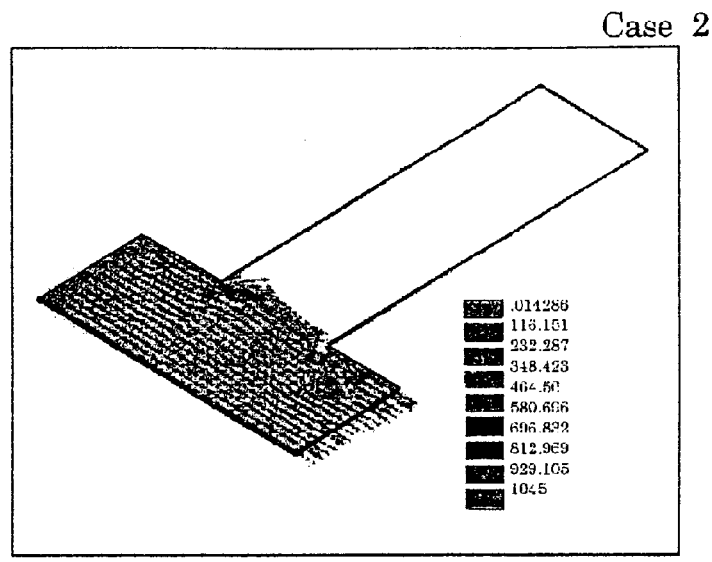
Fig.5-(b) Case 3
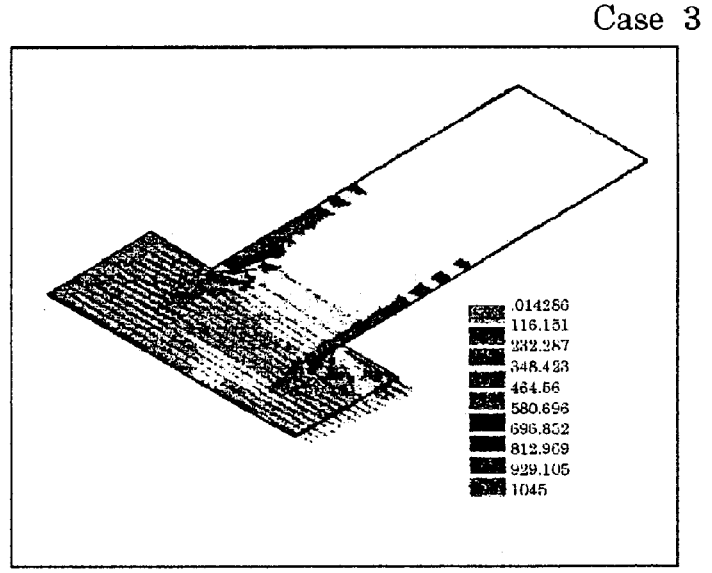
Fig.5-(c) Case 6
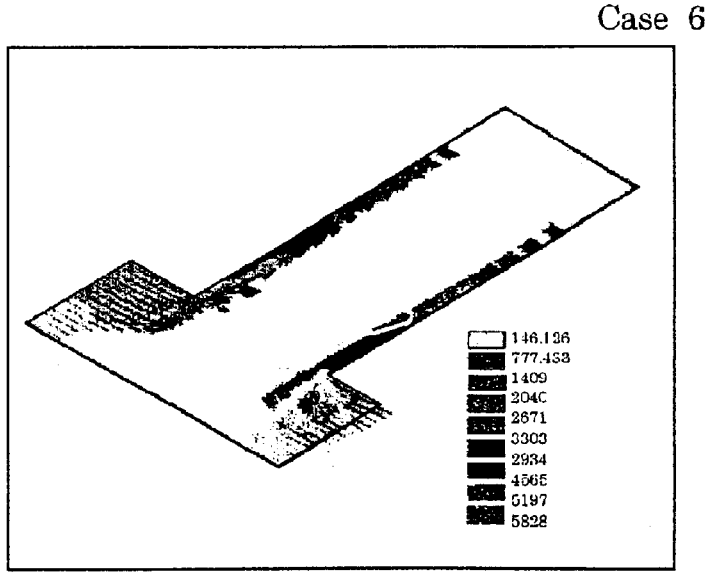

PRIOR ART
Fig.6-(a)  Figure seen from ①
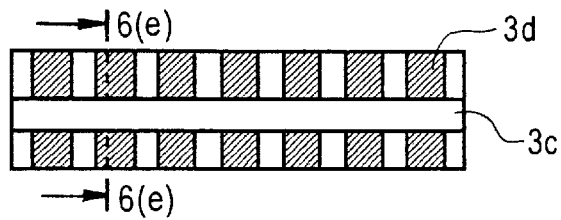
Fig.6-(b)  Figure of plane ② seen from ①
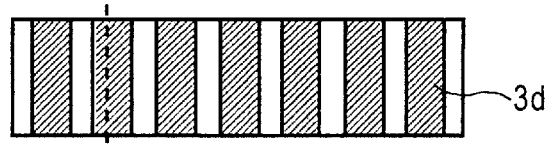
Fig.6-(c)  Figure of plane ③ seen from ①
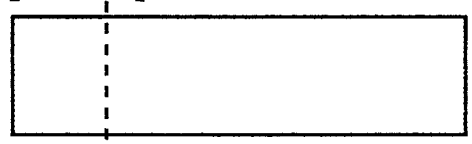
Fig.6-(d)  Figure of lateral view
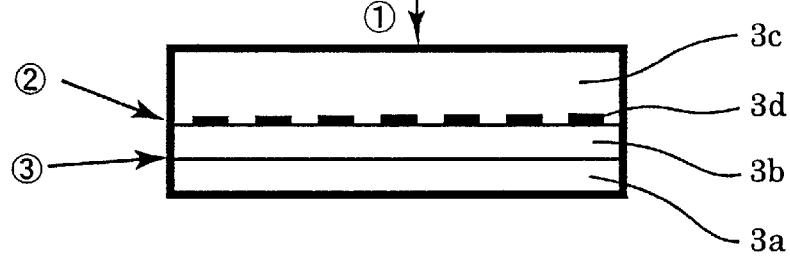
Fig.6-(e)  Figure of cross section ④
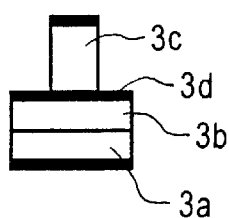

Fig.7-(a) Figure seen from ①
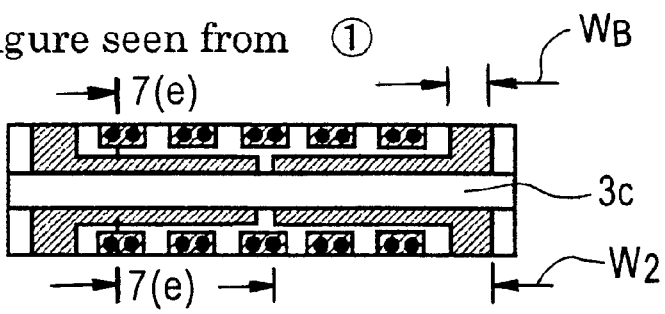
Fig.7-(b) Figure of plane ② seen from ①
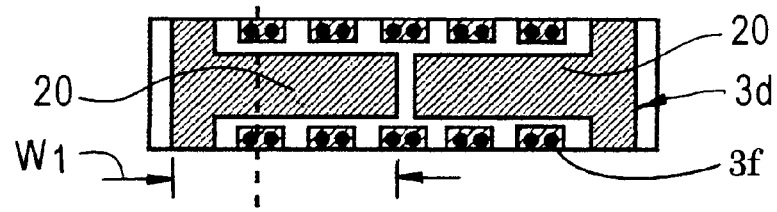
Fig.7-(c) Figure of plane ③ seen from ①
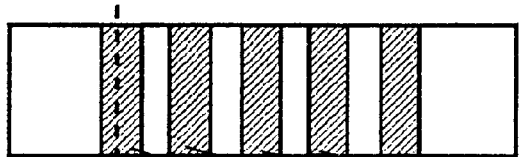
Fig.7-(d) Figure of lateral view
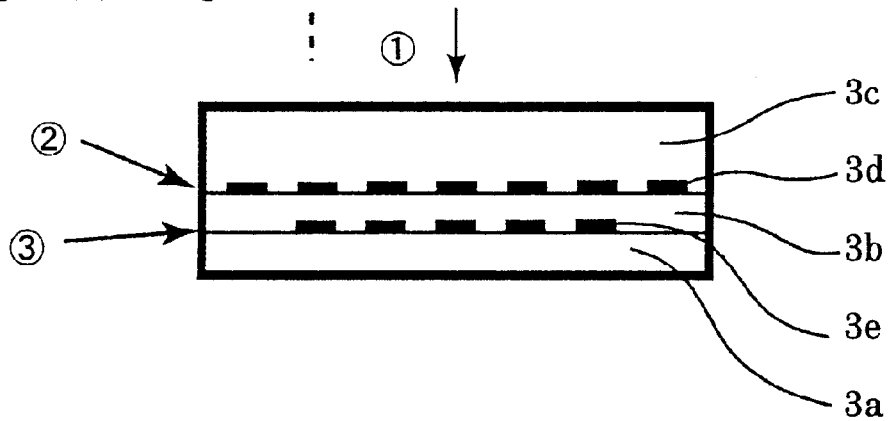
Fig.7-(e) Figure of cross section ④
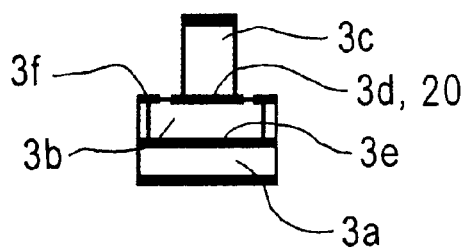

Fig.8-(a) Figure seen from ①
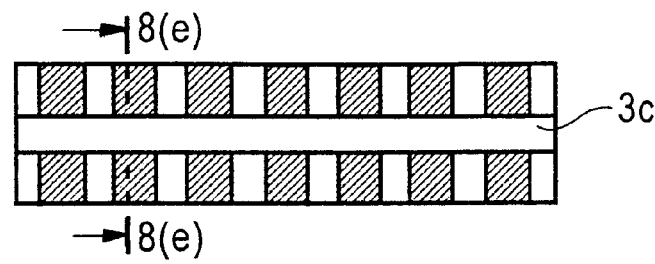
Fig.8-(b) Figure of plane ② seen from ①
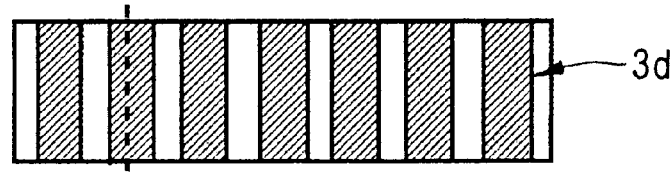
Fig.8-(c) Figure of plane ③ seen from ①
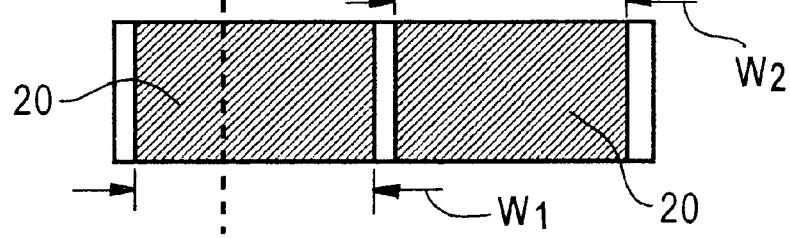
Fig.8-(d) Figure of lateral view
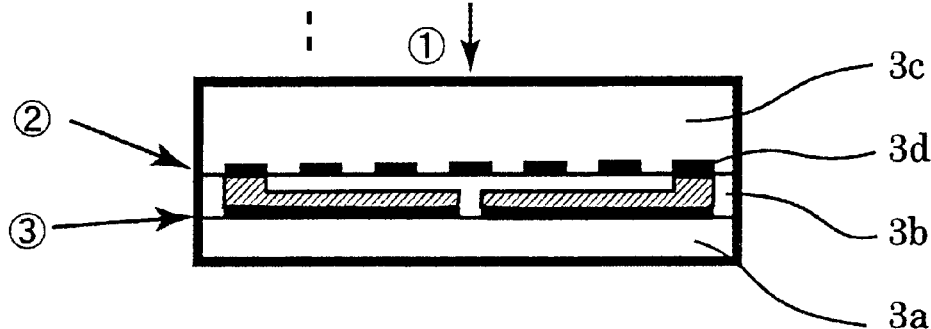
Fig.8-(e) Figure of cross section ④
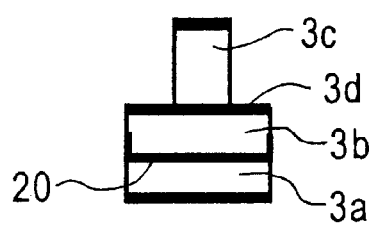

SEALED AIRTIGHT CONTAINER FOR OPTICAL-SEMICONDUCTORS AND OPTICAL-SEMICONDUCTORS MODULE

BACKGROUND OF THE INVENTION

1. Field of the Invention

The present invention relates to a sealed airtight container for housing an optical-semiconductor element. Specifically, it relates to the container for housing an optical-semiconductor amplifier and a light exciting source that include an optical element for which it is required that the amount of the current which flows at a current terminal part is twice or more than twice of the amount of the conventional element.

2. Description of the Prior Art

As shown in FIG. 1, a conventional sealed airtight container for the optical-semiconductors consists of a metal bottom plate 1, a side-frame 7 brazed on the bottom plate, ceramic terminal parts 3 attached to the side-frame, a sealing ring 5 brazed at the upper part, and a cover 11. The metal bottom plate is made of a cooper-tungsten ("Cu—W") alloy, and has an area on which the optical-semiconductor element is set at the central part of its upper surface. The side-frames that surround the area setting the optical-semiconductor element are made of a iron-nickel-cobalt ("Fe—Ni—Co") alloy and have means to fix an optical fiber. The ceramic terminal part to which external lead wires 4 made of a Fe—Ni—Co alloy are connected has a metallized-wiring layer or wiring pattern 3d. The sealing ring is a metal frame that seals the optical-semiconductor airtight.

An optical-semiconductor element and a Peltier element are glued and fixed to the optical-semiconductor element mounting area of the metal bottom plate. Each electrode of the optical-semiconductor element is connected to the metallized-wiring layer connected to lead wires 4 through bonding wires (not shown). And an optical fiber (not shown) is joined to an optical fiber fixing ring 2 of the side-frame by brazing or Yttrium Aluminum Garnet ("YAG") laser irradiation. Finally the upper surface of the seal ring is covered and sealed. The process described above is common to complete the optical-semiconductor module as a unit.

The ceramic terminal part is formed by sintering the two or more layers of a ceramic preform as shown in FIG. 3. Electrical conductivity between the inside and the outside of the sealed airtight container for the optical-semiconductor is acquired by printing the metallized-wiring layer on the surface of each preform before sintering. A heat resistant metal such as tungsten ("W"), molybdenum ("Mo"), manganese ("Mn") is used for the metallizing.

A structure of a ceramic terminal part disclosed in Japanese Patent Application Laid-Open No. 145317/1999 is shown in FIGS. 2 and 3. The width of the metallized-wiring layer 3d on the ceramic surface shown in FIG. 2 is usually uniform in a direction from the front end to the distal end. In some of the sealed airtight containers for high frequency use, in order to avoid the reflective loss due to the mismatch of impedance, the width of the metallized-wiring layer 3d is made smaller partially in the direction from the front end toward the distal end.

An optical fiber fixing ring is prepared in the side-frame. Each electrode of the optical-semiconductor element glued and fixed on the metal bottom plate is connected through a bonding wire to the metallized-wiring layer that is connected to a lead wire. An optical fiber is fixed to the optical fiber fixing ring by YAG welding by irradiation of laser beams. In order to maintain airtightness in a package, a cover is fixed by electric-welding, and an optical-semiconductor module is completed.

With respect to the increased output of the laser diode (LD) used for the optical fiber amplifier or the light source for excitation, the drive current of the Peltier element which cools the LD element has come to need large current. With the structure of the conventional package shown in FIG. 1, since the resistance of the metallized-wiring layer of the ceramic terminal part was comparatively high, when current was passed, it was heated. Conventionally, the heat generation was such a degree as could be ignored since the current to pass was at most about 2A (Amperes). If the current to pass is at least twice of 2A, however, the heat generation cannot be disregarded. Namely, it has become impossible to ignore a temperature rise of the metallized-wiring layer as well as power consumption. With rise in temperature, the resistance of the metallized-wiring layer increases further. Consequently, the various problems had occurred such as a declining of an optical output due to a heated LD element, increased difficulty in the drive control of the Peltier element, or reduced reliability of the wiring layer.

In order to reduce the resistance of the wiring layer formed in the ceramic terminal part, the use of a metal whose electric conduction is superior to heat resistant metal such as tungsten can be considered. However, by this method, since the difference of the thermal expansion coefficient with ceramic becomes large, a crack occurs in the ceramic. Moreover, making the wiring layer thick and lowering the resistance are also considered. However, by this method, during the firing of the preform, an interstice occurs between the ceramic layers and an airtight seal is not possible. Furthermore, resistance can be reduced if the width of the wiring layer is thick. But, it is not possible to expand the width sufficiently because it would cause interference between the adjacent wiring layers, or otherwise the number of terminals decreases.

SUMMARY OF THE INVENTION

In light of the above-described conventional problems, an object of the present invention is to provide an sealed airtight container for optical-semiconductors which can carry a large current of more than the former and whose output is stable, lowering the resistance value of a metallized-wiring layer provided in a ceramic terminal part and thereby reducing the heat generation of a wiring part and maintaining a small power consumption. The object of the present invention is also to provide an optical-semiconductor module using such a sealed airtight container.

This invention is related to a sealed airtight container for optical-semiconductors. And in the sealed airtight container for optical-semiconductors, the width of the exposed electrode part provided in the ceramic terminal part is enlarged, and the exposed electrode part is connected to the wiring part provided in the ceramic terminal part, and the width of the wiring part is equal to the enlarged width of the electrode part.

Furthermore, there are the following means to reduce the electrical resistance further in the sealed airtight container in this invention. The first means to reduce the electrical resistance further is laminating two or more layers of the wiring parts that are separated by the ceramic layer. The second means is pasting the silver brazing alloy on the exposed electrode part. The third means is laminating the Cu layer on the exposed electrode part. The fourth means is laminating the external terminal on the exposed electrode part including the area where the width of the electrode part is made large.

The sealed airtight container for the optical-semiconductor with a small heat generation in the wiring pattern part, a small power consumption and the optical-semiconductor module with a stable optical output can be obtained by lowering the resistance value of the wiring pattern prepared in the ceramic terminal part.

BRIEF DESCRIPTION OF THE DRAWINGS

FIG. 4 is a structural drawing of example 1 and the comparative example.

FIG. 5 is a result of the calculation of a current distribution.

FIG. 6 is a schematic expansion view of a conventional ceramic terminal part.

FIG. 7 is a schematic expansion view of a ceramic terminal part of example 1.

FIG. 8 is a schematic expansion view of a ceramic terminal part of example 2.

DETAILED DESCRIPTION OF THE PREFERRED EMBODIMENTS

The example that carried out the present invention is explained in detail below based on the drawings. FIG. 7 is a schematic expansion view of the ceramic terminal part and the wiring part of the first example of the sealed airtight container of the present invention. FIG. 6 is a schematic expansion view of the ceramic terminal part and the wiring part of the conventional sealed airtight container.

Figure 1:
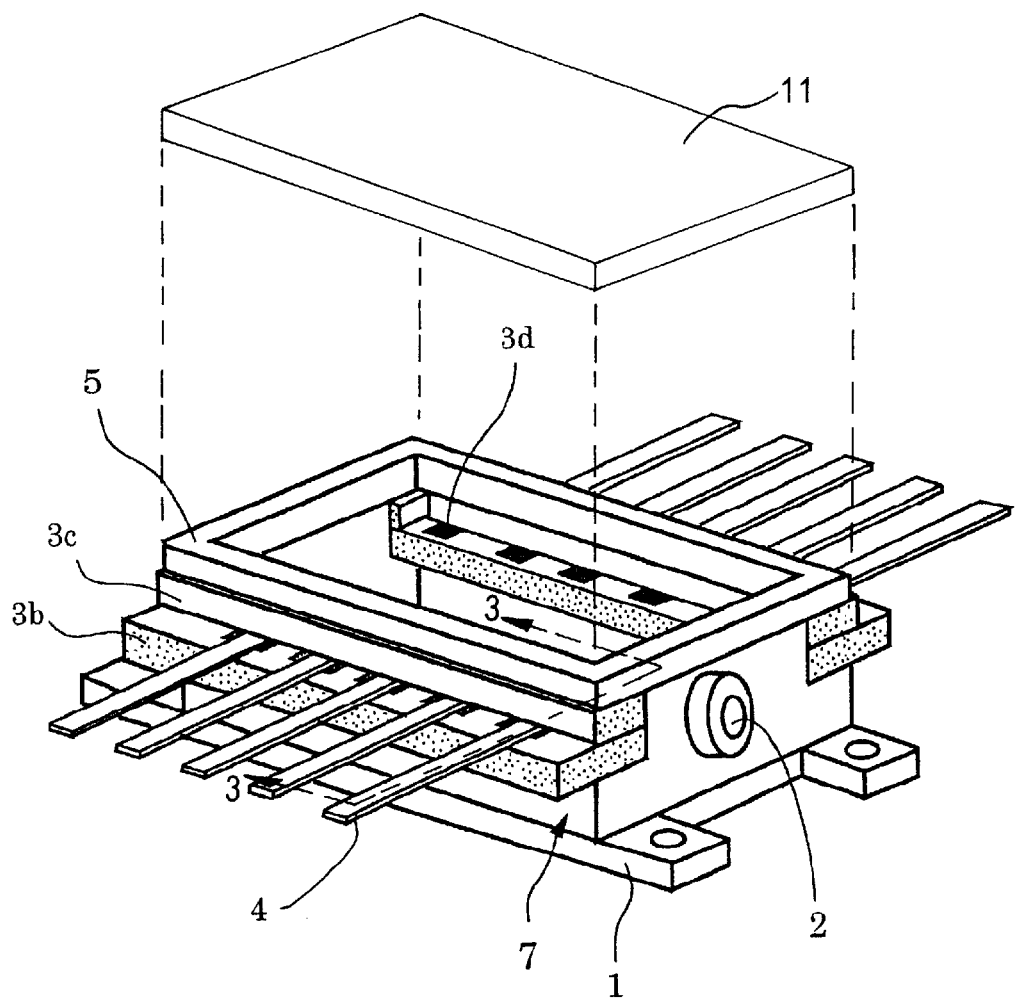
FIG. 1 is a schematic perspective view of a conventional airtightly sealed optical-semiconductor container.
Figure 2:
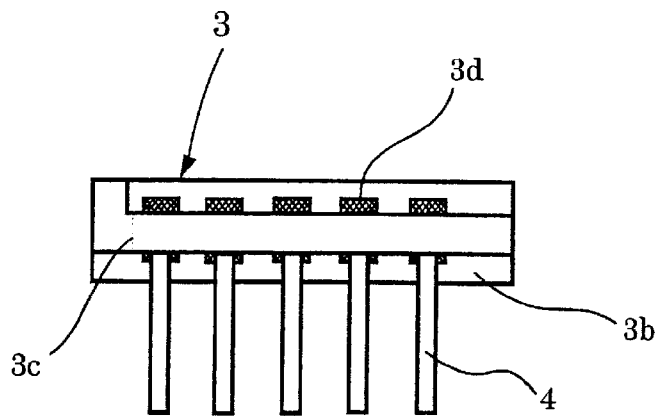
FIG. 2 is a schematic plan view of a conventional ceramic terminal part.
Figure 3:
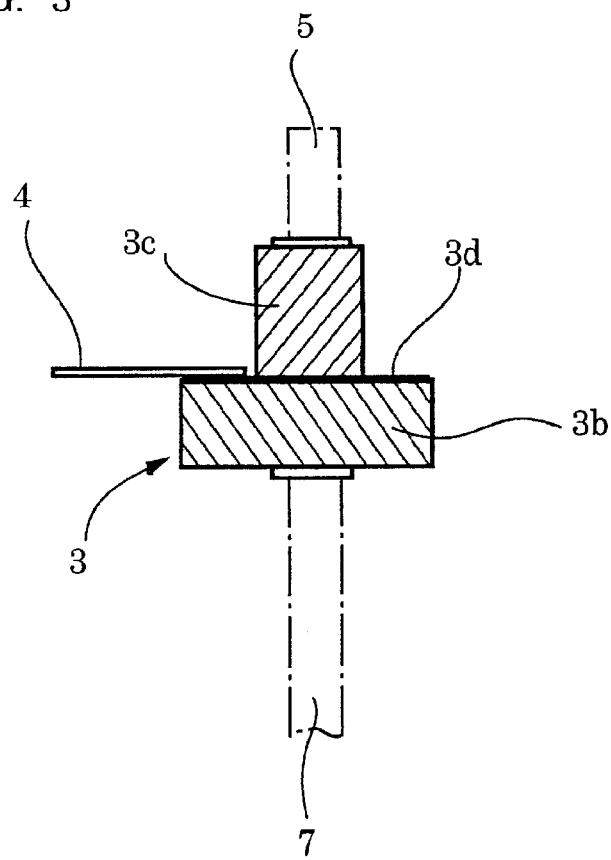
FIG. 3 is a schematic sectional view of a conventional ceramic terminal part.

Each width of the plural wiring patterns 3d that is prepared on the second ceramic layer 3b is the same in FIG. 6. In this case it is possible that the first ceramic layer 3a and the second layer 3b is one body, and it is possible that they are a two-layer structure as shown in FIG. 3. The width $W_1$ and $W_2$ of the wiring patterns 3d at the left end one and the right end one of the wiring patterns 3d on the second ceramic layer 3b in FIG. 7 are partially enlarged relative to the base width $W_B$ of the wiring patterns, forming enlarged portions 20 extending toward the center, respectively. Therefore, the central plural patterns 3e are disposed on a separate position in order to avoid interference with the enlarged portion 20 as shown in FIG. 7. Via holes 3f are arranged in order to obtain electric conductivity between the wiring patterns 3d on the second ceramic layer 3b and the wiring patterns 3e on the first ceramic layer 3a.

The wiring pattern 3d on the second ceramic layer 3b in FIG. 7 of the ceramic terminal part of the present invention consists of the portion in which the surface is hidden by the third ceramic layer 3c and the exposed portion 30 which is not hidden by the third ceramic layer 3c. The resistance of the exposed portion 30 can be lowered by laminating a metal of high electrical conductivity such as gold by plating etc.

One of the wiring patterns 3d on the second ceramic layer 3b in FIG. 6 of the conventional ceramic terminal part is shown schematically in FIG. 4-(a). The portion indicated to be resistance 1 in FIG. 4 shows the portion hidden by the third ceramic layer. The portion indicated to be resistance 2 in FIG. 4 shows the exposed portion 30 that is not hidden by the third ceramic layer. FIG. 4-(b) is a comparative example in which the width of only the portion hidden by the third ceramic layer is expanded. It is preferable for the portion hidden by the third ceramic layer to make the wiring layer thin in order to ease the heat stress produced when firing the ceramic preform and to prevent cracks in the ceramic. In this case, the only means to lower the electric resistance of the wiring layer is to have the wiring layer composed of a metal of excellent electric conductivity.

Thus, the means for lowering the resistance of the portion hidden with the third ceramic layer in the wiring patterns is limited. If the width of the wiring pattern of the portion hidden by the third ceramic layer is made large, lowering the whole resistance is expected. However, since the distribution of current density is not uniform as shown in the case 2 of FIG. 5-(a) in fact, the resistance seldom falls compared with the conventional structure. Then, when the width of the wiring pattern is made large to the exposed portion in which the wiring pattern is not hidden with the third ceramic layer as in FIG. 4-(c), the deviation of the distribution of current density will be eased as shown in case 3 of FIG. 5-(b). Consequently, the decrease of the whole resistance becomes remarkable.

Furthermore, the laminating of the material of high electrical conductivity such as silver brazing alloy and copper on the exposed portion of the wiring pattern can prevent the deviation of the distribution of current density as shown in case 6 of FIG. 5-(c). The resistance of the whole wiring pattern can be dose to the ideal value.

The materials with excellent thermal conductivity and with a small difference of the heat expansion coefficient of each material are used for the members of the sealed container of the present invention. As an example, one of the embodiments is explained below. A Cu—W alloy or a Cu—Mo alloy is used for the bottom plate on which the optical-semiconductor element is set, and an Fe—Ni—Co alloy is used for the side-frame that surrounds the area setting the optical-semiconductor element. Three sheets of aluminum nitride ("AlN") or aluminum oxide ("Al$_2$O$_3$") are used for the ceramic of the ceramic terminal part. Paste is prepared by adding the organic solvent to powder, such as W, Mo, and Mn, and mixing them. The paste containing high melting point metals is coated on the first ceramic layer 3a which is the bottom layer and the second ceramic layer 3b by the well-known screen printing according to the wiring pattern shown in FIG. 4-(c). The penetration holes 3f are opened at the wiring pattern portion of the ceramics of the second ceramic layer, into which the high melting point metal paste is filled. After pressurizing and unifying three sheets of the ceramics including the third ceramic layer 3c that is the top layer, the ceramic terminal part is formed by calcination and sintering the unified ceramic sheets with the wiring pattern consisting of high melting point metal. The ceiling made of Fe—Ni—Co alloy is prepared at the location that has the same level as the upper surface of the ceramic terminal part and the upper surface of the side-frame. The sealed airtight container for optical-semiconductors is obtained by assembling them using silver brazing and by gold plating.

Thus, after setting the optical semiconductor element and the optical fiber in the inside of the constituted container and combining them, the optical-semiconductor module is obtained by sealing with a sealing cover.

The resistance values in each wiring pattern in FIG. 4 are shown in Table 1. The resistance values in the case of laminating the Cu layer on the exposed electrode part 30 and the case of pasting silver brazing on the same are also shown in Table 1. The resistance of the exposed electrode part 30 is shown as resistance 2 in the wiring pattern of FIG. 4-(c).

TABLE 1

| | Wiring pattern in FIG. 4 | Resistance 1 (mΩ) | Resistance 2 (mΩ) | Whole resistance (mΩ) | Note |
|---|---|---|---|---|---|
| Case 1 | FIG. 4-(a) | 8.9 | 1.2 | 10.7 | Conventional structure |
| Case 2 | FIG. 4-(b) | 8.9 | 1.2 | 9.1 | Comparative example |
| Case 3 | FIG. 4-(c) | 8.9 | 1.2 | 7.0 | |
| Case 4 | FIG. 4-(c) | 8.9 | 0.57 | 5.4 | Pasting silver brazing alloy |
| Case 5 | FIG. 4-(c) | 8.9 | 0.15 | 3.5 | Laminating copper layer |
| Case 6 | FIG. 4-(c) | 8.9 | 0.09 | 3.1 | Laminating copper layer |

The resistance of case 1 of the conventional structure was 10.7 mohm. The resistance of case 2 of the comparative example that has the large width of the wiring portion hidden by the 1st ceramic layer was 9.1 mohm and decreased minimally. Case 3 is the wiring pattern of the present invention with the large width of the exposed electrode part 30. The large width of the exposed part 30 is almost equal to the width of the wiring part hidden by the third ceramic layer. The resistance of the case 3 was 7.0 mohm, which was about 30% lower than that of the conventional structure.

Furthermore, in case 4, the resistance was 5.4 mohm by pasting silver brazing alloy with a thickness of 10 µm on the exposed electrode part. The resistance of the case 4 was about half of the resistance of the conventional structure. Furthermore, the electric resistance of case 5 was 3.5 mohm by laminating the copper layer of 0.1 mm on the exposed electrode part. The electric resistance of case 6 with the copper layer of 0.2 mm was 3.1 mohm, which was less than ⅓ of the value of the conventional structure.

FIG. 8 is a schematic expansion view of the ceramic terminal part and the wiring part of the second example of the sealed airtight container of the present invention. The materials of the parts of the ceramic terminal part and the side-frame part and so forth which constituted a container were the same as that of the first example. In the example 2, the wiring patterns that were not needed to lower the resistance were formed on the second ceramic layer 3b as in the conventional structure, and the wiring patterns that were needed to lower the resistance were formed on the first ceramic layer 3a that is the bottom layer. In order to obtain the electric conductivity between the first wiring pattern and the second wiring pattern, W paste was painted to the required portion on the side of the second ceramic layer, and the wiring pattern was formed also on the side of the ceramic layer.

Although the length of the wiring pattern becomes long in the wiring pattern of FIG. 8, since two or more layers of a wiring part can be used, a low resistance of the wiring layer is obtained. Moreover, it is also possible to lower the resistance further by preparing and laminating two or more sheets of the ceramic layer that are the same as the first ceramic layer in respect of wiring pattern.

The ceramic terminal part was prepared by the same process as the first example, although wiring patterns are different from the first example. The side-frame and the bottom plate for mounting the optical-semiconductors were also prepared in the same way as the first example. The sealed airtight container was obtained by assembling them using silver brazing.

Furthermore, it is preferable that the external terminal is the dumet wire structure of the Fe—Ni—Co alloy on which Cu—Ni is plated as the hardness is maintained without the decline of electric resistance.

Thus, after setting the optical semiconductor element and the optical fiber inside of the constituted container, the optical-semiconductor module is obtained by sealing with a cover.

What is claimed is:

1. A sealed optical-semiconductor housing comprising a bottom plate for mounting an optical-semiconductor element thereon, a side-frame, and a sealing cover, the side-frame having means for supporting a ceramic terminal part and means for fixing an optical fiber, and a plurality of electrodes having an outer exposed electrode part, a hidden electrode part covered by a ceramic layer of said ceramic terminal part, and an inner exposed electrode part, wherein, for at least one of said electrodes, a portion of the hidden electrode part is formed as an enlarged portion having a width greater than a width of the outer exposed electrode part, and wherein the outer exposed electrode part of said at least one of said electrodes is connected to an external lead wire.

2. A sealed optical-semiconductor housing according to claim 1, wherein the ceramic terminal part comprises a laminated structure having a plurality of layers and wherein at least two layers of said laminated structure comprise a wiring part.

3. A sealed optical-semiconductor housing according to claim 1, wherein a silver brazing alloy is pasted on the outer exposed electrode part and the inner exposed electrode part.

4. A sealed optical-semiconductor housing according to claim 1, wherein a copper layer is laminated on the outer exposed electrode part and the inner exposed electrode part.

5. A sealed optical-semiconductor housing according to claim 1, wherein a conductive material is laminated on at least one of the outer exposed electrode part and said enlarged portion.

6. An optical-semiconductor module, wherein a sealed optical-semiconductor housing according to claim 1 is used.

7. A sealed optical-semiconductor housing according to claim 1, wherein said enlarged portion of said at least one of said electrode comprises a portion of said outer exposed electrode part such that a portion of the hidden electrode part and a portion of the outer exposed electrode part is formed to have a width greater than a width of a remainder portion of the outer exposed electrode part.

8. A sealed optical-semiconductor housing according to claim 7, wherein said enlarged portion of said at least one of said electrodes comprises a portion of said inner exposed electrode part such that a portion of the hidden electrode part and a portion of the inner exposed electrode part is formed to have a width greater than a width of a remainder portion of the inner exposed electrode part.

9. A sealed optical-semiconductor housing according to claim 8, wherein said portion of said inner exposed electrode part and said portion of said outer exposed electrode part which form part of said enlarged portion extended substantially equidistantly from said ceramic layer.

10. A sealed optical-semiconductor housing according to claim 7, wherein the ceramic terminal part comprises a laminated structure having a plurality of layers and wherein at least two layers of said laminated structure comprise a wiring part.

11. A sealed optical-semiconductor housing according to claim 7, wherein a silver brazing alloy is pasted on the outer exposed electrode part and the inner exposed electrode part.

12. A sealed optical-semiconductor housing according to claim 7, wherein a copper layer is laminated on the outer exposed electrode part and the inner exposed electrode part.

13. A sealed optical-semiconductor housing according to claim 7, wherein a conductive material is laminated on at least one of the outer exposed electrode part, said enlarged portion, and said inner exposed electrode part.

* * * * *